(12) United States Patent
Choi

(10) Patent No.: US 10,795,854 B2
(45) Date of Patent: Oct. 6, 2020

(54) METHOD AND APPARATUS FOR CONSTRUCTING MULTIVALUED MICROPROCESSOR

(71) Applicant: Louisiana Tech Research Corporation, Ruston, LA (US)

(72) Inventor: Chee Hung Ben Choi, Ruston, LA (US)

(73) Assignee: Louisiana Tech Research Corporation, Ruston, LA (US)

( * ) Notice: Subject to any disclaimer, the term of this patent is extended or adjusted under 35 U.S.C. 154(b) by 39 days.

(21) Appl. No.: 15/984,518

(22) Filed: May 21, 2018

(65) Prior Publication Data

US 2019/0018822 A1     Jan. 17, 2019

Related U.S. Application Data

(63) Continuation of application No. PCT/US2017/022339, filed on Mar. 14, 2017.

(Continued)

(51) Int. Cl.

| | |
|---|---|
| *G06F 15/80* | (2006.01) |
| *G06F 15/78* | (2006.01) |
| *G06F 7/38* | (2006.01) |
| *G06F 7/49* | (2006.01) |
| *G06F 9/44* | (2018.01) |

(Continued)

(52) U.S. Cl.
CPC .......... *G06F 15/8007* (2013.01); *G06F 7/38* (2013.01); *G06F 7/49* (2013.01); *G06F 9/30* (2013.01); *G06F 9/3001* (2013.01); *G06F 9/3016* (2013.01); *G06F 9/30018* (2013.01);

(Continued)

(58) Field of Classification Search
CPC .................................................. G06F 15/8007
See application file for complete search history.

(56) References Cited

U.S. PATENT DOCUMENTS

| | | |
|---|---|---|
| 5,017,817 A | 5/1991 | Yamakawa |
| 5,130,704 A | 7/1992 | Ogawa et al. |

(Continued)

OTHER PUBLICATIONS

M. H. A. Khan, "Reversible realization of quaternary decoder, multiplexer, and demultiplexer circuits," Engineering Letters, vol. 15, No. 2, 2007, pp. 203-207. (Year: 2007).*

(Continued)

*Primary Examiner* — Michael J Metzger
(74) *Attorney, Agent, or Firm* — Jones Walker LLP

(57) ABSTRACT

A multivalued microprocessor including a multivalued processing module having a plurality of multivalued processing units constructed with multivalued logic gates. The microprocessor also includes a multivalued register file having a plurality of registers, wherein the registers are constructed with multivalued memory cells. The multivalued microprocessors utilizes two memory modules constructed with multivalued memory cells: one for storing solely instructions and one for storing solely data. A plurality of multivalued buses transmit multivalued data between the processing module, the register file, and the memory modules. A methodology for designing multivalued circuits that are constructed with multivalued logic gates and memory cells. The designs of multivalued memory cells, multivalued tristate buffers, and multivalued decoders using multivalued logic gates.

17 Claims, 15 Drawing Sheets

The High-level Design of a Multivalued Microprocessor

Related U.S. Application Data

(60) Provisional application No. 62/308,289, filed on Mar. 15, 2016.

(51) Int. Cl.
  *G06F 9/30* (2018.01)
  *H03K 19/20* (2006.01)

(52) U.S. Cl.
  CPC .......... *G06F 9/30105* (2013.01); *G06F 9/44* (2013.01); *G06F 15/7817* (2013.01); *H03K 19/20* (2013.01)

(56) References Cited

U.S. PATENT DOCUMENTS

| | | | |
|---|---|---|---|
| 5,227,993 | A | 7/1993 | Yamakawa |
| 5,331,320 | A * | 7/1994 | Cideciyan .......... G11B 20/1496 |
| | | | 341/56 |
| 5,398,199 | A | 3/1995 | Lefons |
| 5,438,533 | A | 8/1995 | Yoshida |
| 5,463,573 | A | 10/1995 | Yoshida |
| 5,467,298 | A | 11/1995 | Yoshida |
| 5,644,253 | A | 7/1997 | Takatsu |
| 5,751,775 | A | 5/1998 | Fensch et al. |
| 5,773,996 | A | 6/1998 | Takao |
| 5,867,423 | A | 2/1999 | Kapoor et al. |
| 5,969,648 | A * | 10/1999 | Garnett .................. H03M 5/20 |
| | | | 341/56 |
| 5,973,960 | A | 10/1999 | Shibata et al. |
| 6,133,754 | A | 10/2000 | Olson |
| 6,218,713 | B1 | 4/2001 | Wakayama |
| 6,674,712 | B1 * | 1/2004 | Yang .................. H04J 13/004 |
| | | | 370/208 |
| 7,979,627 | B2 | 7/2011 | Arakawa |
| 8,064,253 | B2 | 11/2011 | Paul |
| 8,120,384 | B2 | 2/2012 | Olexenko |
| 9,584,259 | B2 * | 2/2017 | Millar .................. H04L 1/0041 |
| 9,742,431 | B1 * | 8/2017 | Babin .................... H03M 5/20 |
| 2006/0259744 | A1 * | 11/2006 | Matthes ............. G06F 15/7867 |
| | | | 712/220 |
| 2009/0300333 | A1 | 12/2009 | Harper, III |
| 2009/0324247 | A1 | 12/2009 | Kikuchi |
| 2011/0010493 | A1 | 1/2011 | Kimura et al. |
| 2013/0205413 | A1 * | 8/2013 | Grocutt .................. G06F 21/52 |
| | | | 726/30 |

OTHER PUBLICATIONS

Ascia, G.; Catania, V.; Russo, M.; "VLSI hardware architecture for complex fuzzy systems" IEEE Transaction on Fuzzy systems, vol. 7, issue 5, Oct. 1999, p. 553-570.

Catania, V.; Puliafito, A.; Russo, M.; Vita, L.; "A VLSI fuzzy inference processor based on a discrete analog approach," IEEE Transactions on Fuzzy Systems, vol. 2, Issue 2, May 1994, p. 93-106.

Epstein, George, "The Lattice Theory of Post Algebras", Transactions of the American Mathematical Society, vol. 95, No. 2, pp. 300-317, May 1960.

PCT Application No. US2017/022339; International Search Report and Written Opinion of the International Searching Authority for Applicant Louisiana Tech Research Corporation dated Jul. 13, 2017.

* cited by examiner

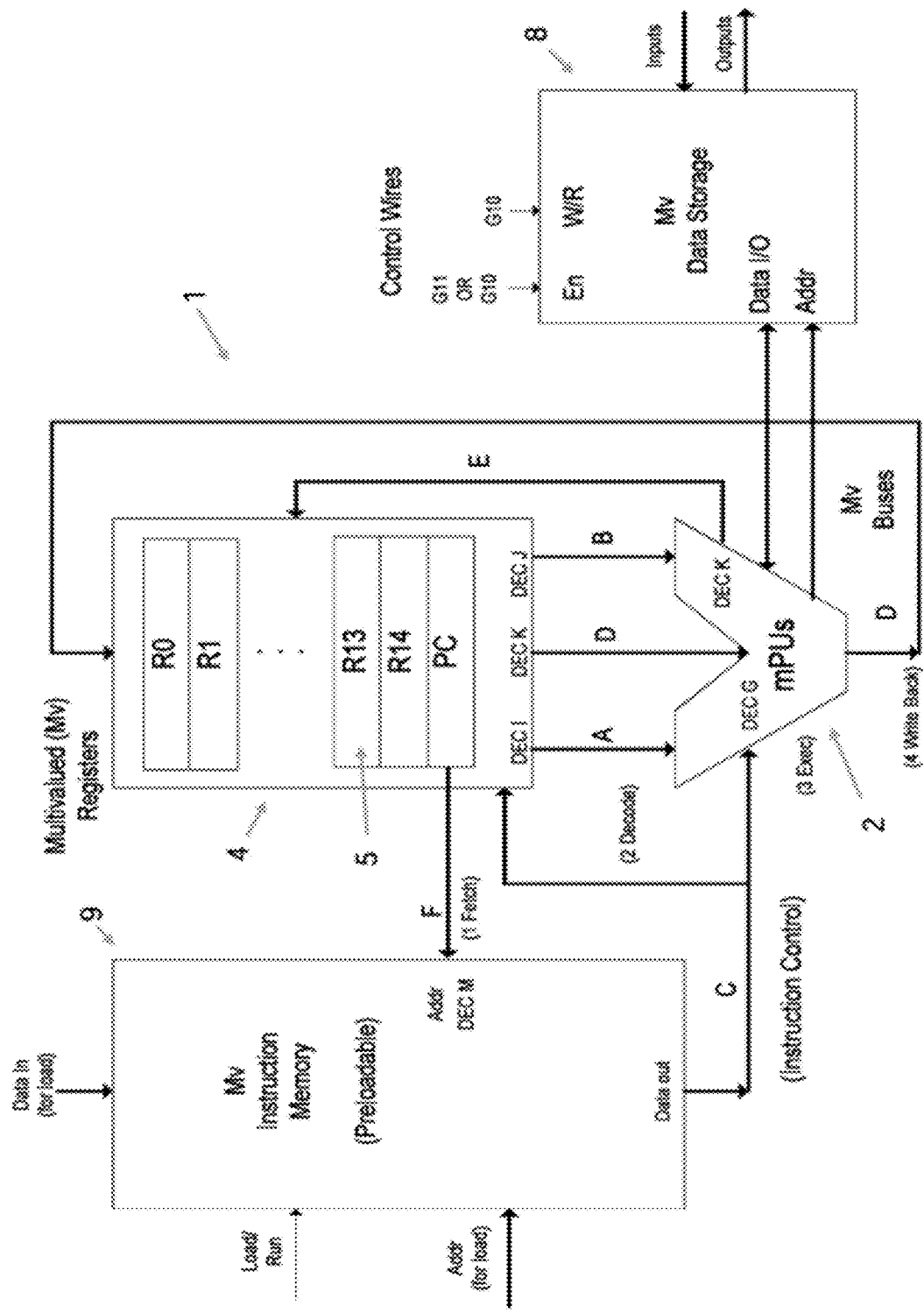
Figure 1. The High-level Design of a Multivalued Microprocessor

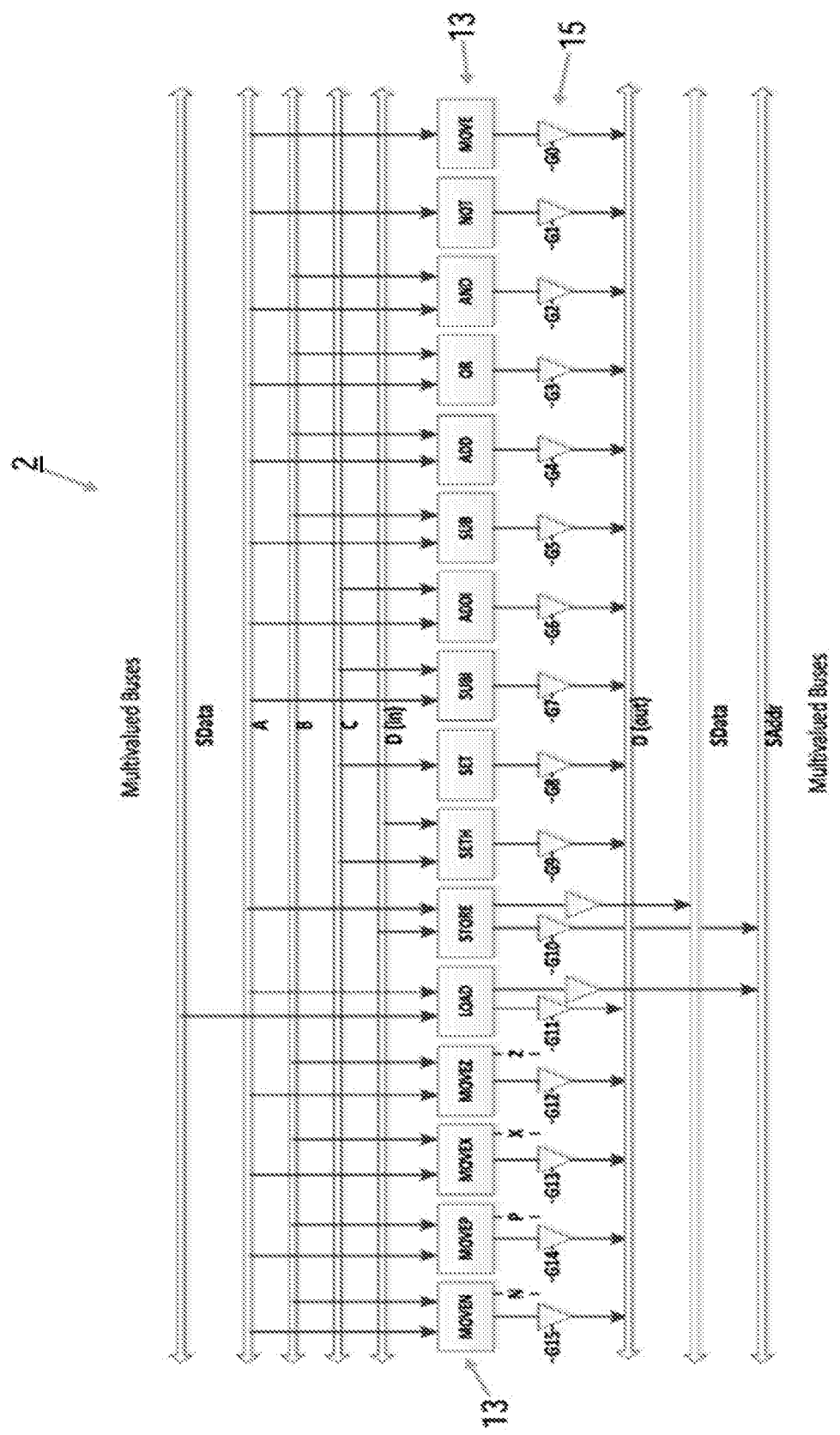
Figure 2. Connecting Multivalued Processing Units to Multivalued Buses

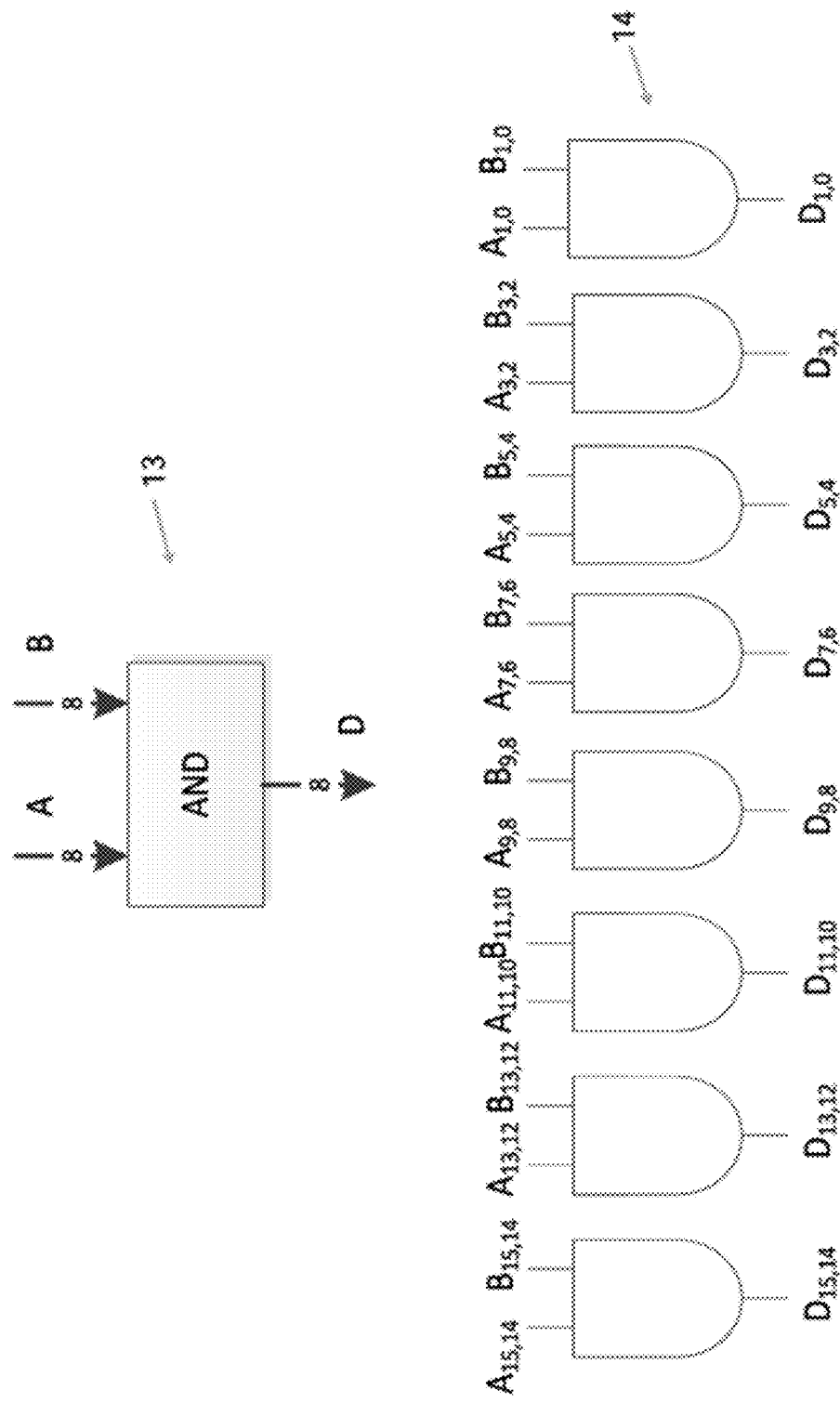
Figure 3. Implementation of a 16-bit AND Operation Using 4-valued Logic Circuits

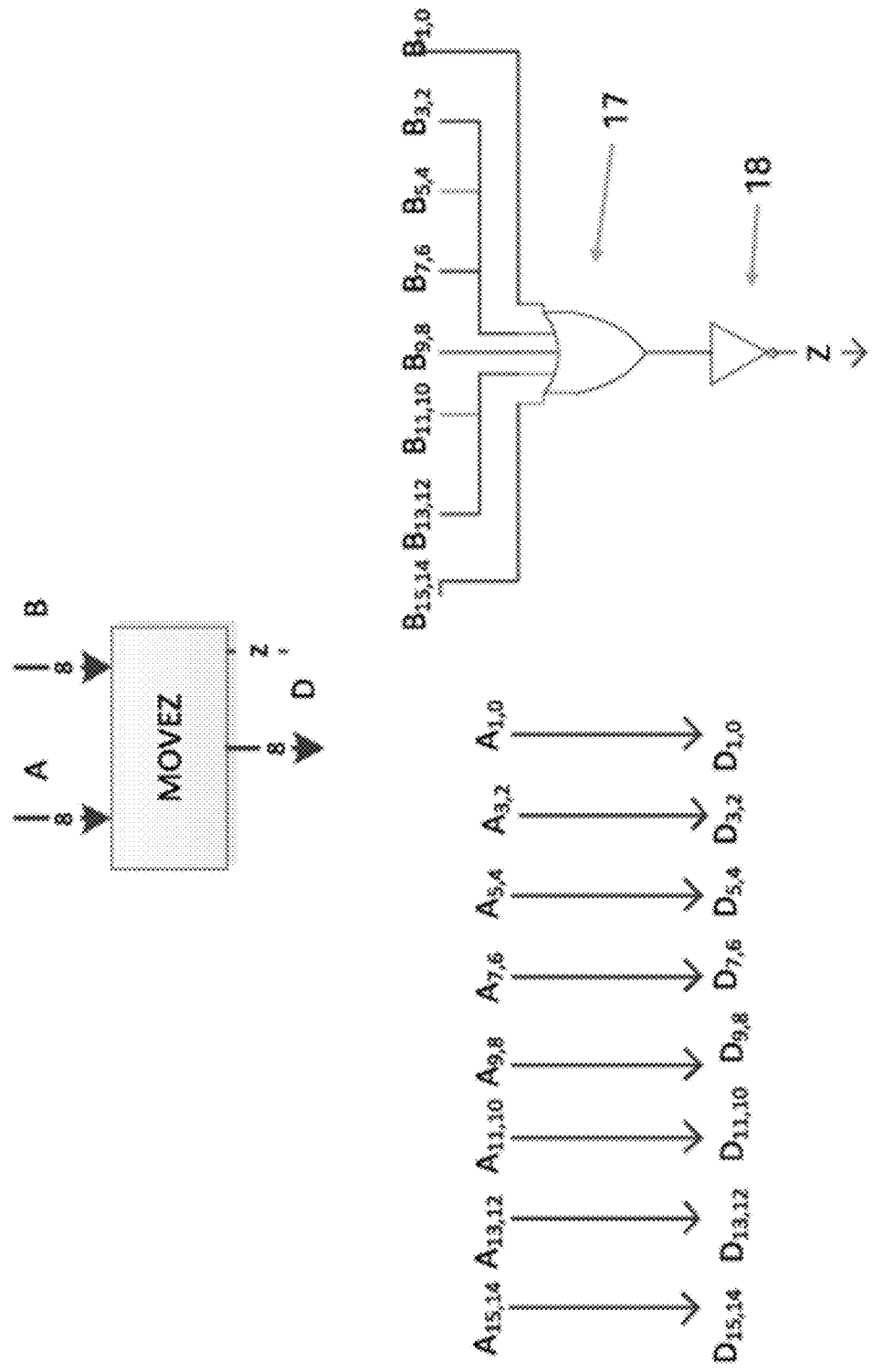
Figure 4. Implementation of a 16-bit MOVEZ Operation Using 4-valued Logic Circuits.

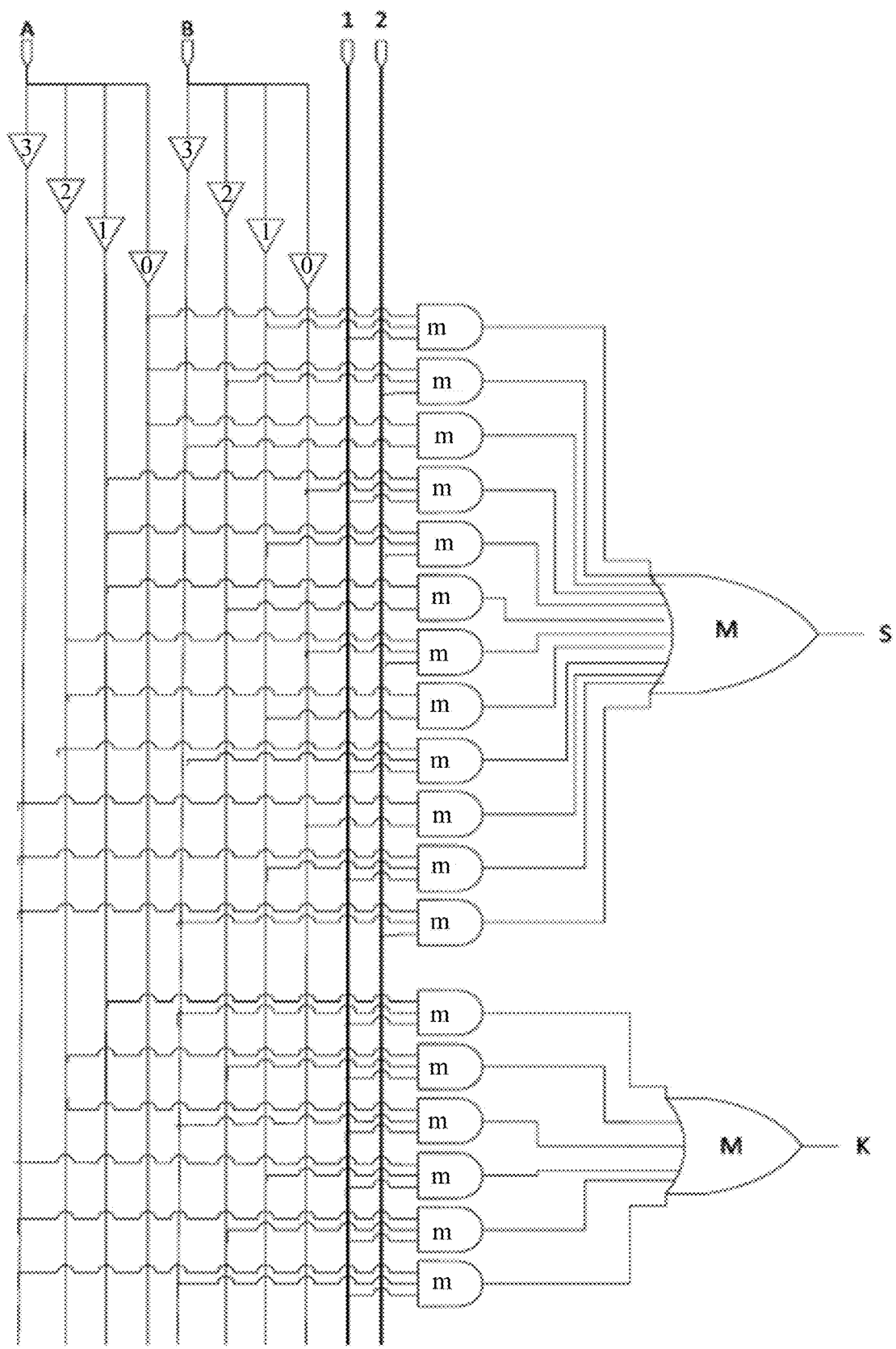
Figure 5. The Design of a Four-valued Adder Circuit for Building Arithmetic Operations

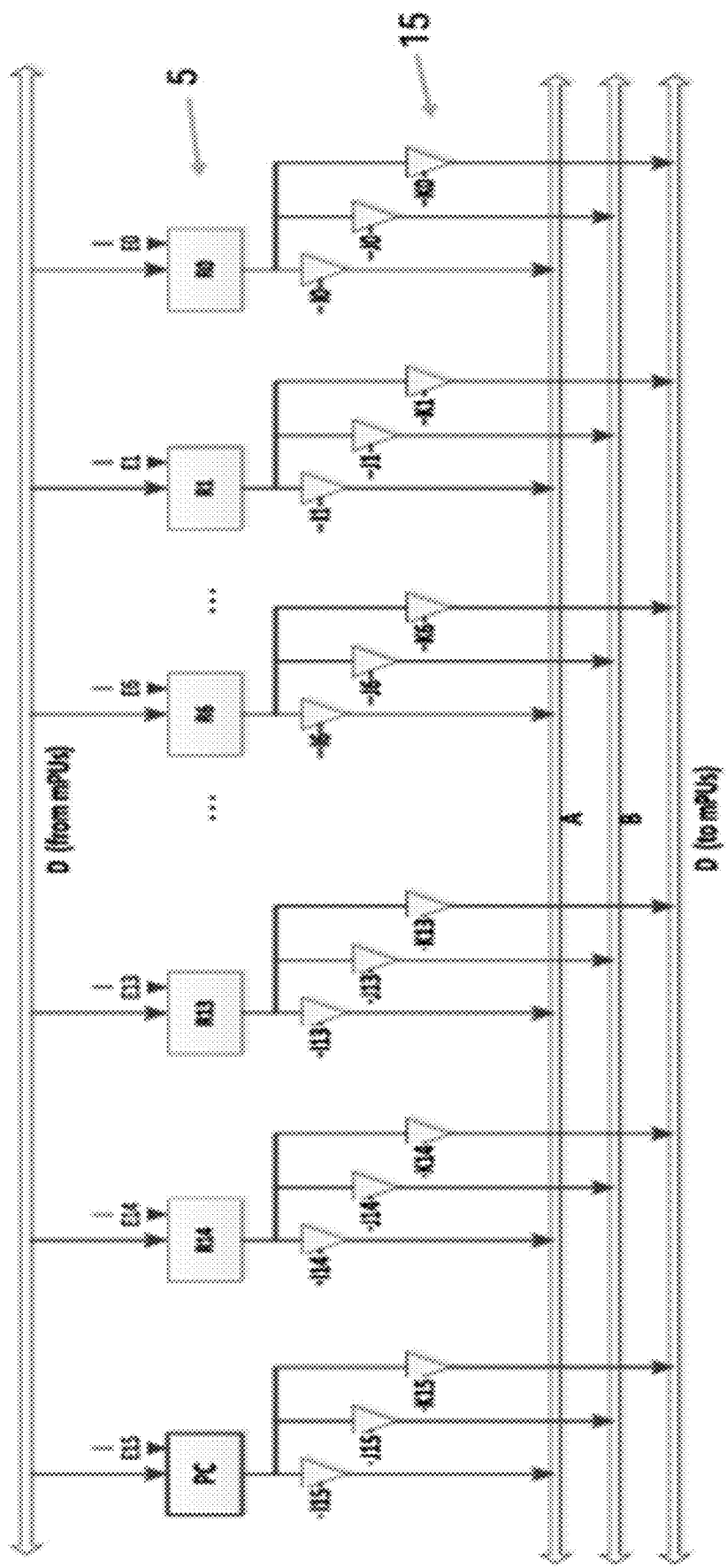
Figure 6. Connecting Multivalued Registers to Multivalued Buses

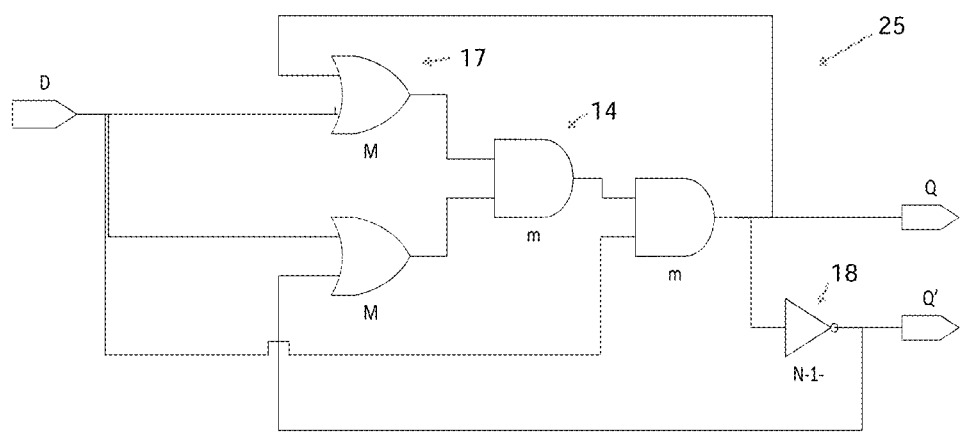
Figure 7. The Design of a Multivalued Memory Cell using Multivalued Logic Gates

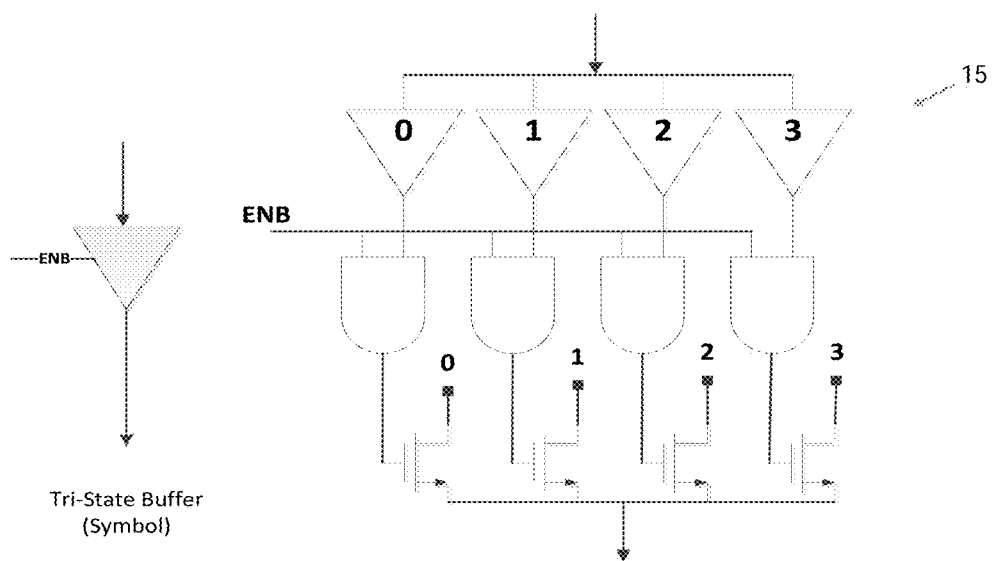
Figure 8. The Design of a Four-valued Tristate Buffer

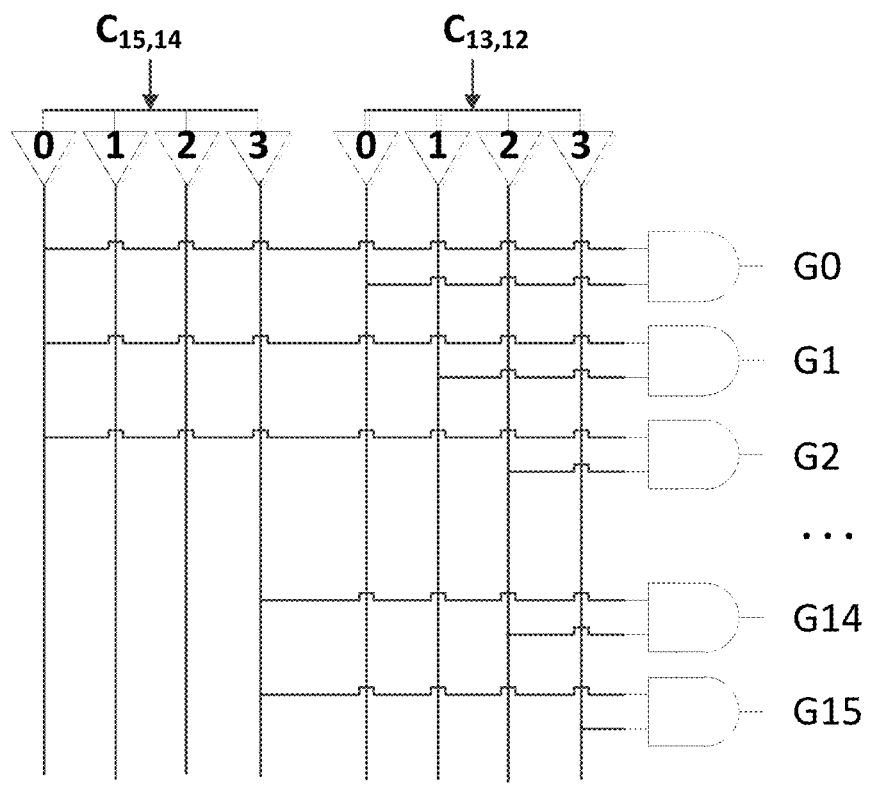
Figure 9. The Design of a Decoder from 2 Four-valued Wires to 16 Control Signals

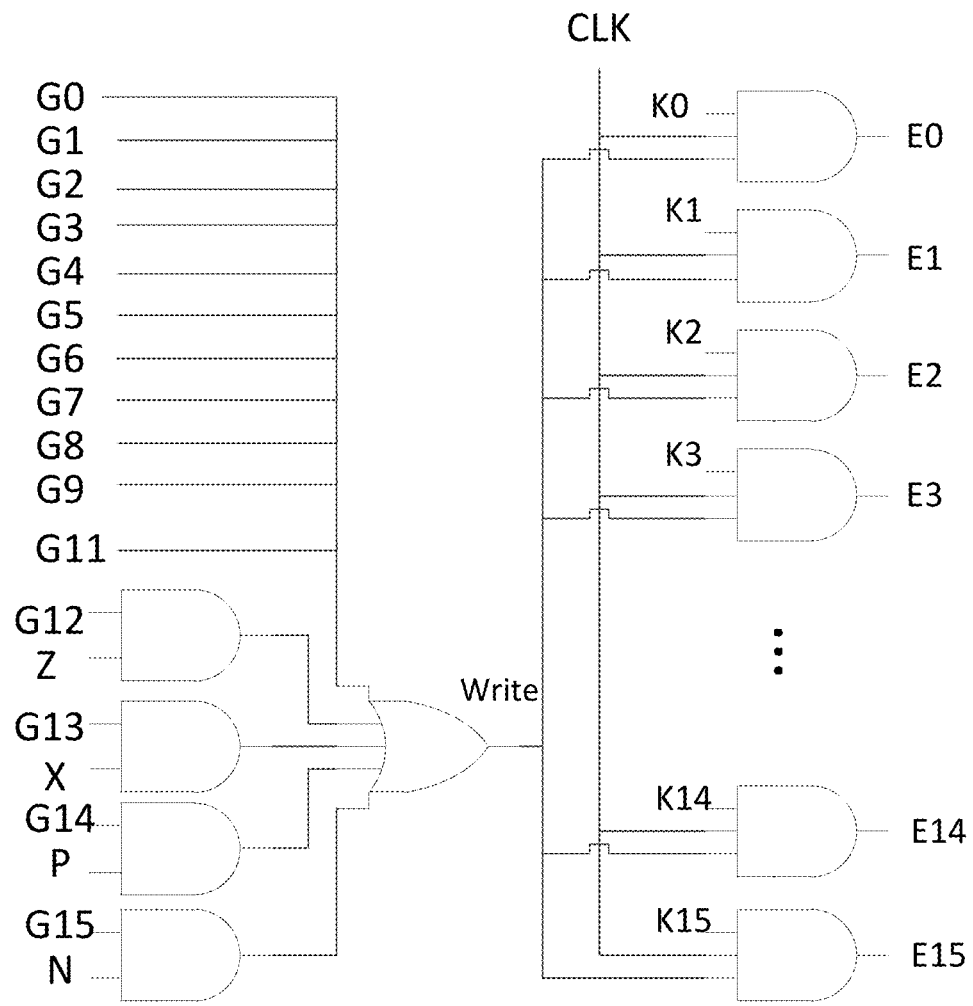
Figure 10. The Design of the Control Circuit to Enable Write to Registers.

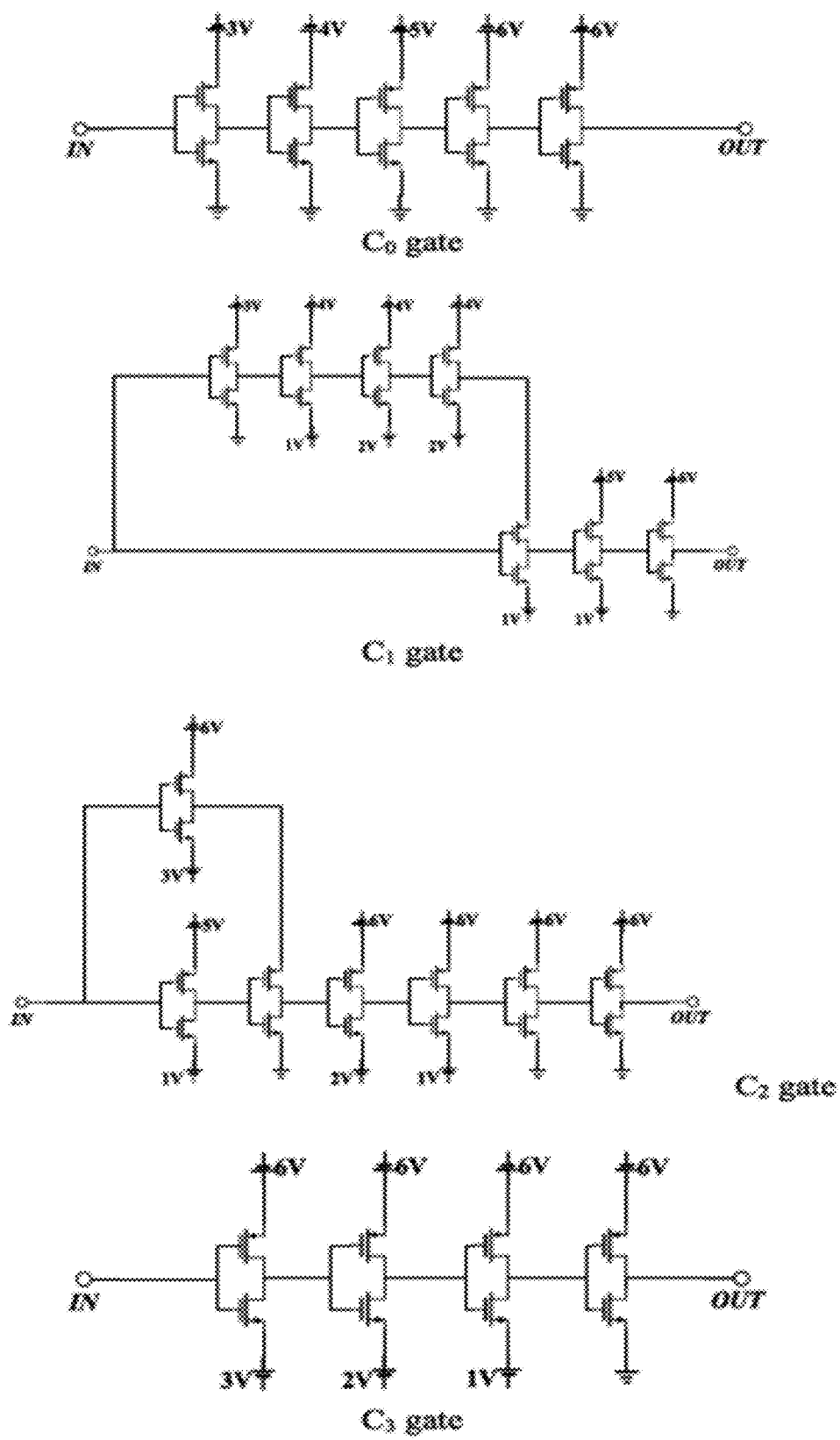
Figure 11. Implementations of $C_0$, $C_1$, $C_2$, and $C_3$ gates

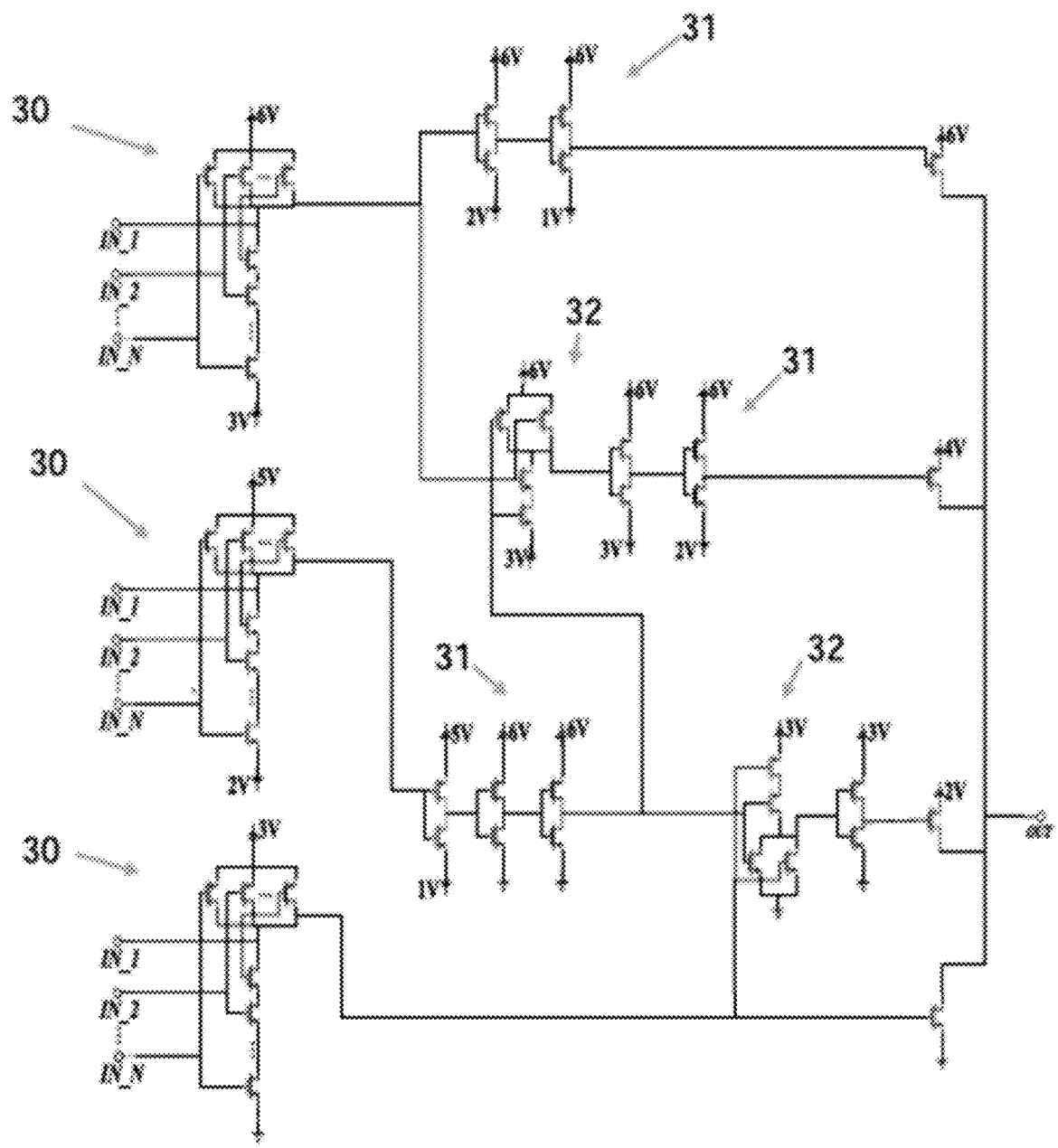
Figure 12. Implementation of an N-input 4-valued AND gate

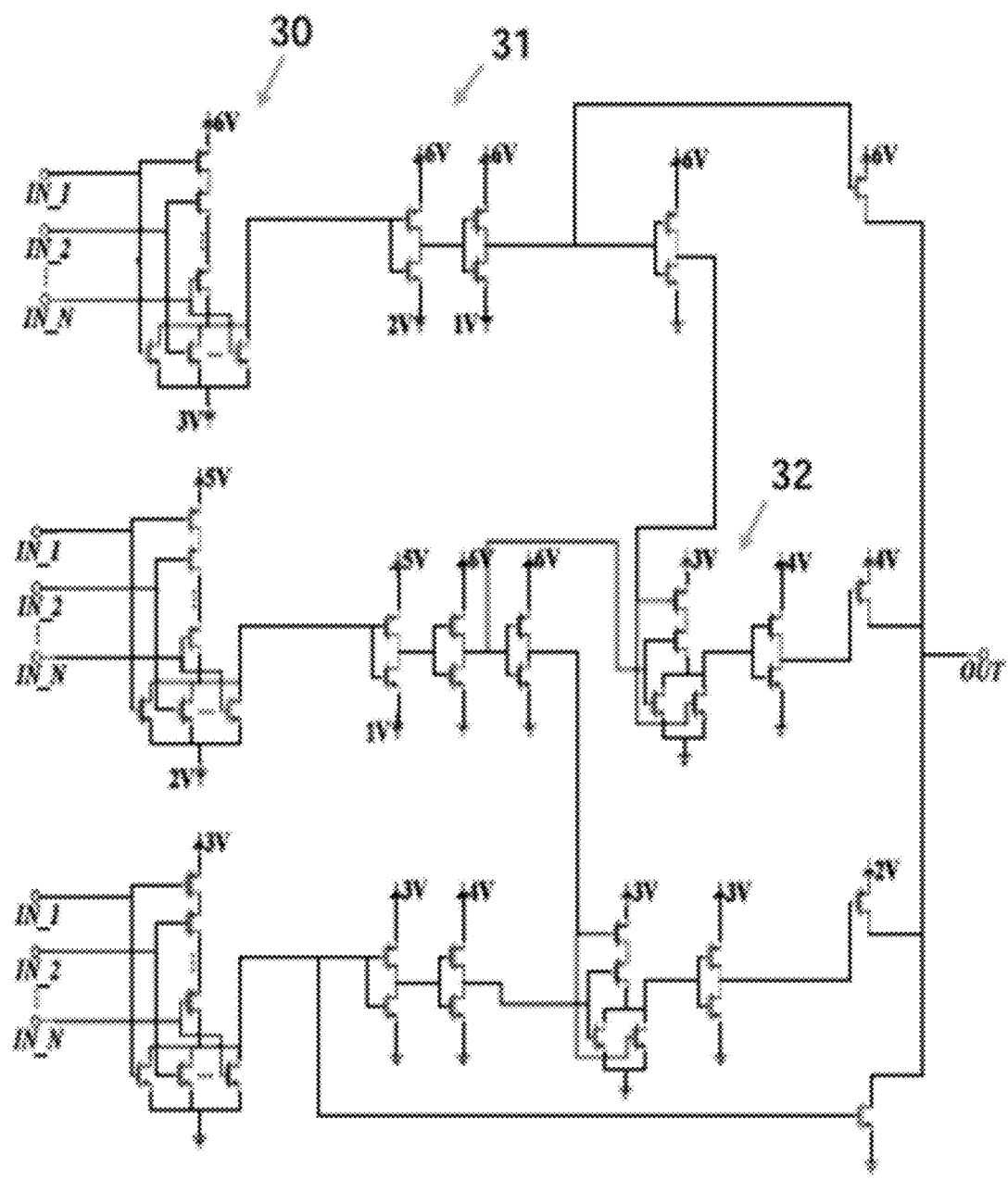
Figure 13. Implementation of an N-input 4-valued OR gate

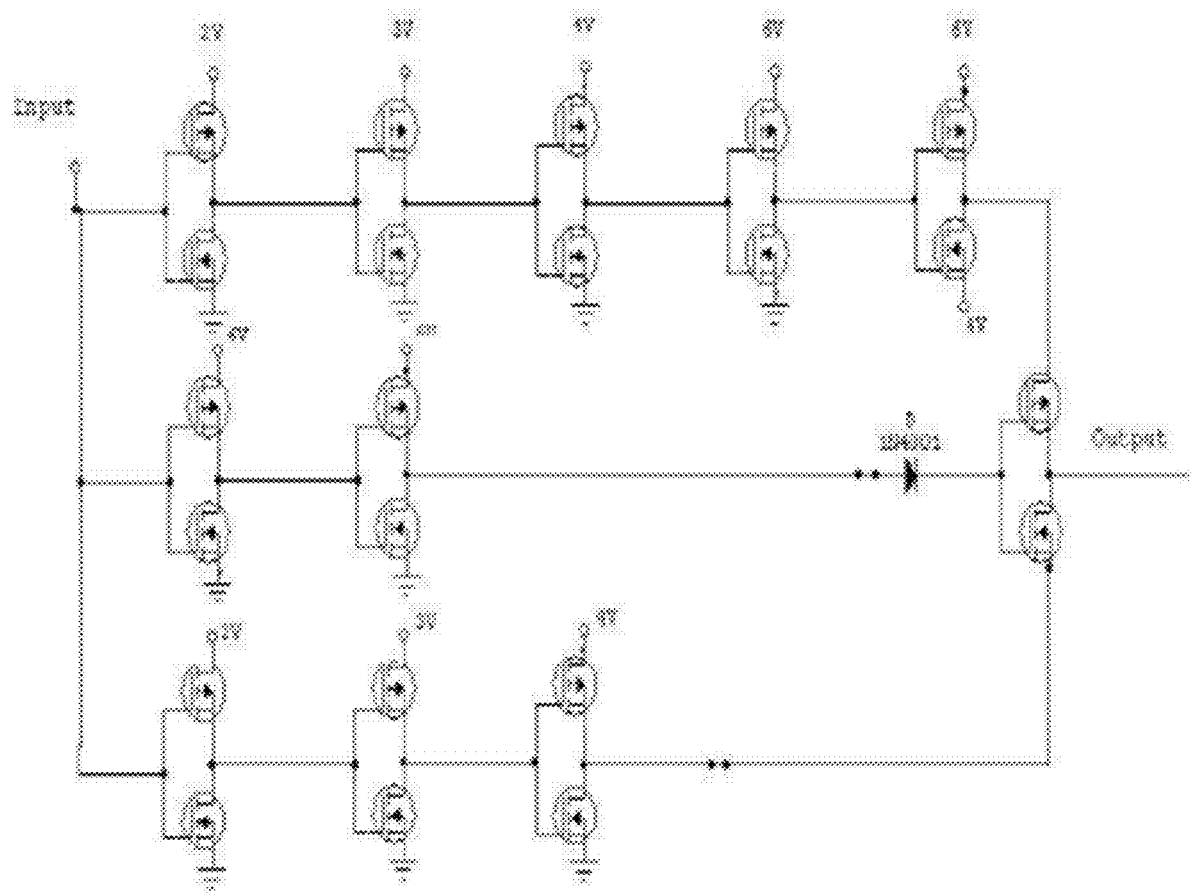
Figure 14. Implementation of a 4-valued NOT gate

```
// Multiply bitwise
// R3 = R1*R2

Set(R3,0)           // R3 = 0
Set(R0,1)           // Set test bit
And(R4, R0, R1)     // Test bit n << Loop here
Addi(R5, PC, 3)     // Save jump address in R5
Movez(PC, R5, R4)   // Skip next Add if R4==0
Add(R3, R3, R2)     // R3 = R3 + R2
Add(R0, R0, R0)     // Shift left test bit
Add(R2, R2, R2)     // Shift left R2
Subi(R6, PC, 6)     // Save jump address in R6
Movep(PC, R6, R0)   // Loop back if R0 is positive
```

Figure 15. A Sample Program for Multiplication

METHOD AND APPARATUS FOR CONSTRUCTING MULTIVALUED MICROPROCESSOR

CROSS REFERENCE TO RELATED APPLICATION

This application is a continuation of PCT/US17/22339 filed Mar. 14, 2017 which claims the benefit of U.S. Provisional No. 62/308,289 filed Mar. 15, 2016, both of which are incorporated by reference herein in their entirety.

FIELD OF THE INVENTION

This invention relates to the fields of computer architecture, microprocessor design, multivalued logic circuits and memory, and digital design.

BACKGROUND OF INVENTION

The performance of current computers is reaching their limit. Almost all present day computers are built based on two-valued logic. In two-valued logic, each wire can have two states. The performance of current computer depend primarily on how quickly the states can be changed, which determines the clock speed. During the past decades, the clock speed for CPU had doubled almost every year. In recent years, the clock speed doubled every 18 months. Now, it has become progressively more difficult to increase the clock speed. The limit is approaching. Recently, CPU manufacturers have tried to circumvent the limitation of clock speed by packing ever more "cores" into a chip, which has resulted in dual-core or quad-core CPUs. However, this multi-core approach does not greatly improve the performance. This is due in part to a limit on the amount of data that can be transferred between the CPU and its connected components, which is in turn determined by the number of pins on the CPU. Using two-value logic, each pin on the CPU can have at most two states, and again the amount of data that can be transferred is determined by the clock speed. Thus, the multi-core approach does not circumvent the limitation.

Thus, there is a need for an innovative approach in order to push the speed limit of computing. Advancing from two-valued to 4-valued (also sometimes referred to as "quaternary") logic provides an progressive approach. Four symbols {0, 1, 2, 3} are needed to distinguish the four values, as shown in Table 1.

TABLE 1

Representations of a 4-valued Variable

| Symbol | DNA | Probability | Bits | Integer | Digit |
|--------|-----|-------------|------|---------|-------|
| 0 | A | 0 | 00 | 0 | 0 |
| 1 | T | 1/3 | 01 | 1 | 1 |
| 2 | C | 2/3 | 10 | 2 | 2 |
| 3 | G | 1 | 11 | 3 | 3 |

The four values may represent any four things, such as the four bases {A, T, C, G} found in DNA, or the probability {0, 1/3, 2/3, 1}. These four values can be converted to binary numbers {00, 01, 10, 11}, or they can simply represent integers or digits {0, 1, 2, 3}. The four values could obviously be implemented with four voltage levels, e.g., {0V, 5V, 10V, 15V}.

To fully exploit the multivalued computational paradigm, it is advantageous to start from the ground up by designing components needed for constructing multivalued logic circuits. For example, each 4-valued logic gate will operate upon two bits of data at a time, and each memory cell will record two bits at once. With this design, each wire or CPU pin can have four states, which could double the amount of data that can be transferred between the CPU and its connected components without increasing the number of pins on the CPU. With eight-valued logic, each logic gate operates three bits of data and each CPU pin carries three bits of data at a time. Thus, the n-value logic described herein contemplates n values of 4, 8, 16, 32, 64, etc. The extreme case will be the infinite-valued logic.

The approach for using multivalued logic is currently being employed in building higher capacity flash memory. The industry is pushing to allow each memory cell to store not just one bit, but two bits, three bits, and even four bits. The prior arts includes U.S. Pat. Nos. 5,017,817, 5,227,993, 5,398,199, 5,438,533, 5,463,573, 5,467,298, 5,644,253, 5,773,996, 5,867,423, 5,973,960, 6,133,754, 6,218,713, 7,979,627, 8,064,253, and 8,120,384.

SUMMARY OF INVENTION

One aspect of this invention provides methods and apparatuses to increase the speed of computation by creating new types of computers that are capable of working on multiple values. This concept exploits the multivalued computation in hardware by using fundamental building blocks of multivalued logic circuits: multivalued logic gates, memory cells, and flip-flops. To make multivalued computation possible, the below described embodiments provide the necessary methods and tools for designing and building multivalued computers entirely within the domain of multivalued logic. The process is to design a multivalued microprocessor based entirely on multivalued circuits and then to use the microprocessors to build multivalued computers. Another aspect of this invention provides a method for designing multivalued microprocessors, by providing the overall architecture, defining the instruction set, providing designs of the processing units, the registers, and the control units. To implement these designs in hardware, the designs of multivalued memory cells, tristate buffers, and decoders are also provided. To build multivalued computers using multivalued logic gates and memory, further embodiments provide a methodology for designing any multivalued circuit to implement any multivalued function. The design of an adder for adding two four-valued numbers is provided to illustrate the methodology.

BRIEF DESCRIPTION OF DRAWINGS

FIG. 1 illustrates one embodiment of a high-level design of a multivalued microprocessor.

FIG. 2 illustrates one embodiment of a processing module connecting multivalued processing units to multivalued buses.

FIG. 3 illustrates one embodiment of a 16-bit AND Operation Using 4-valued Logic Circuits.

FIG. 4 illustrates one embodiment of a 16-bit MOVEZ Operation Using 4-valued Logic Circuits.

FIG. 5 illustrates one embodiment of a 4-valued Adder Circuit for Building Arithmetic Operations.

FIG. 6 illustrates one embodiment of a register file connecting multivalued registers to multivalued buses.

FIG. 7 illustrates one embodiment of a multivalued memory cell using multivalued logic gates.

FIG. 8 illustrates one embodiment of a 4-valued tristate buffer.

FIG. 9 illustrates one embodiment of a decoder from two 4-valued wires to 16 control signals.

FIG. 10 illustrates one embodiment of a control circuit to enable writing to registers.

FIG. 11 illustrates one embodiment of 4-valued Component gates.

FIG. 12 illustrates one embodiment of a N-input 4-valued AND gate.

FIG. 13 illustrates one embodiment of a N-input 4-valued OR gate.

FIG. 14 illustrates one embodiment of a 4-valued NOT gate.

FIG. 15 illustrates one embodiment of a sample program for multiplication.

DETAILED DESCRIPTION OF SELECTED EMBODIMENTS

The process for designing and building multivalued computers includes a process for designing and building multivalued microprocessors. After construction of multivalued microprocessors, multivalued computers may then be constructed by combining one or multiple multivalued microprocessors. Thus, the description of one embodiment will focus on constructing multivalued microprocessors. The description starts by providing the high-level design of the multivalued microprocessor, highlighting the overall architecture, and defining the instruction set. The description continues with the design of the multivalued processing units and then provides a methodology for designing any multivalued circuit. To illustrate the methodology, a multivalued circuit for adding two multivalued numbers is disclosed. The description further illustrates the design of one example of a multivalued memory cell that is used in the design of multivalued registers. The description then provides one example design of a 4-valued tristate buffer and a decoder that are used for the design of a control circuit. The description concludes with an example of certain programming aspects of the microprocessor.

The high-level architecture of one embodiment of the multivalued microprocessor 1 is shown in FIG. 1, which highlights the major components of the computational model. The processor includes the register file 4 having 16 registers 5 (R0, R1, . . . . R14, PC) for storing multivalued data that are encoded with n digits (where n>2). The register PC is the program counter of the processor. As explained in more detail below, one advantageous feature of this design is that the program counter can be read or written to by any instruction. The processor consists of at least one processing module 2 for preforming computations on the multivalued data. A processing module includes at least one processing unit. In an embodiment where there is a single processing module 2 having one single processing unit, the processing module may be considered analogous to an Arithmetic Logic Unit (ALU). In other embodiments where there are multiple processing modules and multiple register files, the embodiments are analogous to a multi-core processor. Another advantageous feature of the illustrated embodiment is that the processor comprises of two separated memory modules: the instruction memory module 9 stores solely instructions, while the data storage module 8 stores solely data. The memory modules are separate in the sense of transferring data independently to and from the processing module through separate buses. However, other embodiments could combine the instruction memory and the data storage on the same module. The illustrated instruction memory module 9 can be built with nonvolatile memory (such as flash memory) that allows the instructions to be pre-loaded. As show in FIG. 1, the microprocessor includes various multivalued buses (labeled A, B, C, and so on), which in the FIG. 1 embodiment, each have m n-valued wires, and connect the major components for allowing information to be transferred between the components or modules. A multivalued signal (e.g., 4-valued in this example) may sometimes be referred to as a multi-valued digit (i.e., a "digit" representing either 0, 1, 2, 3). A bus formed of m wires (e.g., eight), with each wire carrying a multivalued signal, may sometimes be referred to as a multi-digit bus or multi-wire bus.

The process of preforming one computation specified by one instruction is outlined as follows. The program counter (PC) register contains the address of the instruction to be executed. First, this address is passed to the instruction memory 9 through the F bus (as shown in FIG. 1). The instruction memory 9 retrieves the instruction and outputs it on the C bus. Second, the wires of the C bus act as the control signals which are passed to various decoders (DEC) that decode the instruction to select which registers and which processing units 13 (described below) are to be used to perform the instruction. Third, the processing module 2 receives the data from the selected registers through A, B, and D buses, performs the computation, and sends the result through D bus to be stored in the destination register. Fourth, a control circuit sends enable signals through E bus to determine whether to write the result into the registers and into which register to write. The final step is to update the contents of the program counter (PC), which will increase by one if it is not updated by the instruction. Any instructions written into the program counter (PC) will function as a Jump statement (as described below).

The microprocessor can be built to perform any number of instructions. In the illustrated embodiment, a simple instruction set is defined. For this design, the microprocessor can perform 16 instructions that are defined as shown in Table 2.

TABLE 2

Instruction Formats and Definitions using 4-valued Codes

| 4-valued Op-Code | Format | Definition |
| --- | --- | --- |
| 00 | Move (Rd, Ra) | Rd ← Ra |
| 01 | Not (Rd, Ra) | Rd ← digit-wise NOT Ra |
| 02 | And (Rd, Ra, Rb) | Rd ← Ra digit-wise AND Rb |
| 03 | Or (Rd, Ra, Rb) | Rd ← Ra digit-wise OR Rb |
| 10 | Add (Rd, Ra, Rb) | Rd ← Ra + Rb |
| 11 | Sub (Rd, Ra, Rb) | Rd ← Ra − Rb |

TABLE 2-continued

Instruction Formats and Definitions using 4-valued Codes

| 4-valued Op-Code | Format | Definition |
| --- | --- | --- |
| 12 | Addi (Rd, Ra, v2) | Rd ← Ra + v2 (where v is 2 4-valued data) |
| 13 | Subi (Rd, Ra, v2) | Rd ← Ra − v2 |
| 20 | Set (Rd, v4) | Rd ← 4 0's follow by v4 (where v4 is 4 4-valued data) |
| 21 | Seth (Rd, v4) | Rd ← v4 follow by Rd7, 6, Rd5, 4 . . . Rd1, 0 |
| 22 | Store (Rd, Ra) | DataStorage [Rd] ← Ra (where Rd used as address) |
| 23 | Load (Rd, Ra ) | Rd ← DataStorage[Ra] (where Ra used as address) |
| 30 | Movez (Rd, Ra, Rb) | Rd ← Ra IF Rb == 0 (zero) |
| 31 | Movex (Rd, Ra, Rb) | Rd ← Ra IF Rb != 0 (not zero) |
| 32 | Movep (Rd, Ra, Rb) | Rd ← Ra IF Rb15 == 0 (positive) (test bit 15 of Rb) |
| 33 | Moven (Rd, Ra, Rb) | Rd ← Ra IF Rb15 == 1 (negative) (test bit 15 of Rb) |

The first instruction is the Move (Rd, Ra) operation that implements Rd=Ra, where Rd is one of the 16 registers for storing the result of the operation, and Ra is anyone of the 16 registers. For example, Move (R2, R1) will results in R2=R1 (the contents of register R2 is replaced by the contents of R1). Sometimes Rd will be referred to as the "destination register" (the register where the results of the operation are stored) and Ra will be referred to as the "operand register" (the source of the number being operated upon). The Move operation has one operand register while operations like Add have two operand registers. The Not, And, Or functions are logic operations. The Add, Sub, Addi, and Subi functions are arithmetic operations. For instance, Add(R3, R2, R1) will results in R3=R2+R1, while Subi(R3, R1, 5) will results in R3=R1−5. The Set and Seth put a constant value into a register. For example, Set(R3, v4) puts the value v4 into R3. In the embodiment where each register can store eight 4-valued numbers, Set(R3, v4) puts 4 zeros on the "left" or 'high' part of the R3 register and the four 4-valued numbers v4 on "right" or "low" part of the R3 register. Seth(R3, v4) puts into R3 the four 4-valued numbers v4 on the high part of the register and leaves the low part unchanged. The Store and Load functions transfer data between registers and the Data Storage module. The Movez, Movex, Movep, and Moven functions are conditional move statements. For instance, Movez(R5, R7, R9) will results in R5=R7 only if R9 is zero, otherwise R5 remains unchanged.

As suggested above, an advantageous feature of this microprocessor is that anyone of these 16 instructions can write into the program counter PC and thus can function as a Jump statement. For example, Move(PC, R1) will jump to the address specified by R1, while Movz(PC, R1, R2) will jump only if R2 is zero (a conditional jump), and Addi(PC, PC, 8) will function as a relative jump for jumping forward.

Each of the instructions is encoded with 4-valued numbers (0,1,2,3). The 16 operation codes (op-code) is encoded with two 4-valued numbers as show in Table 2. The 16 registers are also referred to with two 4-valued numbers. For instance, Add(R3, R2, R1) is coded with 02 03 02 01, where the leftmost 02 is the op-code for Add, the 03 refers to register R3, the 02 to R2, and the 01 to R1. Thus, only 8 of the 4-valued digits are needed to encode one instruction.

The computational model and the instructions described above will serve as a prototype for the design and the implementation of a microprocessor using multivalued circuits. As previously suggested, one major advantage of using multivalued circuits to implement a microprocessor (or a computer) is to reduce the number of wires and components, as will be described in the following sections.

Designing Multivalued Processing Units

This section realizes the design of a microprocessor, and more specifically the processing module 2, by using multivalued circuits. The design begins by implementing the multivalued processing units 13. As shown in FIG. 2, one example embodiment of the processing module is formed of 16 multivalued processing units 13, each of which implements the operation of one instruction. The processing units 13 take input data from the A, B, C, D(in), and SData multivalued buses, execute the specified operations, and pass the results to the D(out), SData, and SAddr output buses through multivalued tristate buffers 15. There are 16 control signals (G0, G1, . . . G15) which enable the tristate buffers and are used to select the results of which processing unit should be available on the output bus based on which instruction is being executed. The control signals and the tristate buffers are discussed in more detail further below.

For the example embodiment of the multivalued microprocessor described herein, the implementation of the processing units 13 will be done by using 4-valued logic circuits, although 16-valued logic circuits would also be well suited (or potentially even greater-valued logic circuits). Each of the processing units 13 in this example will be implemented by using 4-valued logic circuits: each (4-valued) wire can carry 2 bits of data at any given time (4 states) and each (4-valued) logic gate can operate on 2 bits of data at a time. For instance, the design of the AND processing unit 13 is shown in FIG. 3. The AND operation takes 8 wires (realizing 16 bits) as input from A bus and 8 wires as input from B bus; performs the digit-wise AND operation using 8 4-valued AND gates 14; and outputs the results using 8 wires as bus D (realizing 16 bits outputs). In this case, the number of wires and gates is reduced by 50% in comparison to conventional digital microprocessors. In general, an n-valued AND gate will take two or more n-valued inputs and produce one n-valued output which transmits the minimal value of all the inputs. Thus, each of the 4-value AND gates 14 in FIG. 3 will transmit the lesser of Ai,j or Bi,j as the output Di,j. The subscripts i and j indicate the bit positions represented by that number, e.g., A3,2 indicates the bit 3 and bit 2 of the 16-bit representation of A.

The OR and NOT processing units can be implemented using the same method as outlined for the AND processing unit. An n-valued OR gate takes two or more n-valued input wires and produces one n-valued output wire that transmits the maximal value of all the input wires. Likewise, a n-valued NOT gate takes an n-valued input wire and produces an n-valued output wire that transmits the value of (n−1) minus the input value.

FIG. 12 illustrates one embodiment for an N-input, n-value AND gate where n=4. The left-most portion of the circuit includes three (n−1) banks 30 of transistors, with each bank 30 receiving as inputs all of the N signals. There are N p-type transistors connected in parallel (on top part) and N n-type transistors connected in serial (on bottom part). This bank 30 of N+N transistors performs the function of a NAND operation. Those banks 31 with one p-type and one n-type transistors performs the function of a NOT operation. Those banks 32 with transistors connected in serial on top part and transistors connected in parallel on the bottom part perform the function of a NOR operation. The drains of the right-most transistors are shown connected to 6V, 4V, 2V which will represent the values 3, 2, and 1 respectively. As suggested above, the lowest value of the N inputs will bias the appropriate one of the right-most transistors to provide the circuit output.

FIG. 13 shows one embodiment of an N-input, 4-value OR gate. Similar to the AND gate in FIG. 12, the OR gate's N input signals are process by the NOR banks 32 of transistors, the NOT banks 31 of transistors, and the NAND banks 30 of transistors. In this case, the highest value of the N inputs will bias the appropriate one of the right most transistors. The NOT gate embodiment shown in FIG. 14 also utilizes p-type transistor and n-type transistor (although different symbols are used in the figure). Each of the transistor pairs performs the NOT operation. The supply voltages of each of the NOT pairs are chosen to gradually change the input voltage into the final output voltage. Of course, multivalued logic gates could be formed from circuits other than those seen in FIGS. 12-14. For example, other multivalued AND and OR circuits are disclosed in (1) Ascia, G.; Catania, V.; Russo, M.; "VLSI hardware architecture for complex fuzzy systems" IEEE Transaction on Fuzzy systems", vol. 7, issue 5, October 1999, p 553-570; and (2) Catania, V.; Puliafito, A.; Russo, M.; Vita, L.; "A VLSI fuzzy inference processor based on a discrete analog approach," IEEE Transactions on Fuzzy Systems, vol. 2, Issue 2, May 1994, p 93-106, both of which are incorporated by reference herein.

The MOVE, SET, SETH, STORE, and LOAD processing units are primarily composed of a set of wires for transferring specific digits from the input to the output of the processing units (see FIG. 4). The MOVEN, MOVEP, MOVEX, and MOVEZ also contains logic gates for checking the enabling conditions. For instance, the design to implement the MOVEZ(Rd,Ra,Rb) operation is shown in FIG. 4. This operation copies data from A bus to D bus when B is equal to zero. Since each of the 4-valued wire carries 2 bits, only 8 multivalued wires are needed to carry the 16-bit data. This circuit produces a conditional signal Z that is used for the control circuit (described later in FIG. 10). The condition of B being zero (the signal Z) is determined by inputting to OR gate 17 the eight wires of bus B and the output of the OR gate being fed to the NOT gate 18. The output of the NOT gate is Z, which is used in the control circuit (described later in FIG. 10) to determine whether to write the results into a register. If Z is True, the results (from the D bus) will be written into a register, while if it is False, the results will not be written into any register.

The remaining processing units, ADD, SUB, ADDI, and SUBI, all require the function of adding two numbers. For instance, SUB (A−B) is implemented as A+(−B). These processing units may be implemented using a general methodology for designing multivalued circuits as described in the following.

A General Method for Designing any Multivalued Circuits

This disclosure further provides a general method for designing any multivalued circuit. It has been shown mathematically that any multivalued function can be decomposed into three types of basic operations. Epstein, George, "The Lattice Theory of Post Algebras", Transactions of the American Mathematical Society, Vol. 95, No. 2, pp. 300-317, May, 1960, which is incorporated by reference herein in its entirety. For designing multivalued circuits, three types of multivalued logic gates ("Component gates," AND gates, and OR gates) are combined to form the required circuit.

A Component gate takes one input and produce one output. For a n-valued input x, there are n component gates $C_i(x)$ for $0 \le i \le n-1$. The $C_i(x)$ gate produces an output n−1 (also sometimes referred to as "high" or "true") whenever x is equal to i, otherwise it produces an output 0 (also sometimes referred to as "low" or "false"). For example, if a 4-valued input x is equal to 2, then the Component gates would output $C_0(x)=0$, $C_1(x)=0$, $C_2(x)=3$, and $C_3(x)=0$.

FIG. 11 illustrates a series of transistor-based circuits which may function as one embodiment of the Component gates, C0, C1, C2, and C3. When the C0 gate receives the multivalued input, the five pairs (p-type and n-type) of NOT function blocks gradually change the input voltage into the required output voltage. Similarly, C1, C2, and C3 gates utilize multiple NOT function blocks having different supply voltage to gradually convert the input voltage into the require voltage. An alternative type of component gate is disclosed in FIGS. 5-7 of U.S. Pat. No. 5,227,993 to Yamakawa, which is incorporated by reference herein in its entirety. As referenced above, a multivalued AND gate takes two or more inputs and produce one output that is the minimal value of the inputs. A multivalued OR gate takes two or more inputs and produce one output that is the maximal value of the inputs.

The methodology can be used to design any multivalued circuit, although the design of a 4-valued adder is provided to illustrate the method. The following outlines a four-step process for designing multivalued circuits to implement any multivalued (n-valued) function. The four steps are: (1) Creating a truth table to define the function; (2) Connecting each input x to n Component gates; (3) Creating an AND gate for each output instance having a value>0; and (4) Connecting the outputs of all the AND gates to an OR gate, which produces the final outputs of the required function. These 4 steps are described in more details in the following:

Step 1. Truth Table: Creating a Truth Table to Define the Multivalued Functions

For illustrating the method, this description provides the design for an adder which adds two 4-valued numbers A, B. First, a truth table is created to define the required functions, as shown in Table 3.

TABLE 3

Table Defining a 4-valued Adder

| Input | | Output | |
|---|---|---|---|
| | | $4^1 x$ | $4^0 x$ |
| A | B | K | S |
| 0 | 0 | 0 | 0 |
| 0 | 1 | 0 | 1 |
| 0 | 2 | 0 | 2 |
| 0 | 3 | 0 | 3 |
| 1 | 0 | 0 | 1 |
| 1 | 1 | 0 | 2 |

TABLE 3-continued

Table Defining a 4-valued Adder

| Input | | Output | |
|---|---|---|---|
| | | $4^1x$ | $4^0x$ |
| A | B | K | S |
| 1 | 2 | 0 | 3 |
| 1 | 3 | 1 | 0 |
| 2 | 0 | 0 | 2 |
| 2 | 1 | 0 | 3 |
| 2 | 2 | 1 | 0 |
| 2 | 3 | 1 | 1 |
| 3 | 0 | 0 | 3 |
| 3 | 1 | 1 | 0 |
| 3 | 2 | 1 | 1 |
| 3 | 3 | 1 | 2 |

All possible input combinations are shown in column A and B. The results of the addition is encoded by two outputs K and S, where K stands for carry and S stands for sum, and the total value is 4K+S. The column K defines the function required to produce K as output, and the column S defines the function required to produce S as output. FIG. 5 illustrates a multivalued circuit corresponding to the truth table. The steps below show how the number and connection of the gates are derived. The input 1 in FIG. 5 provides logical 1 value, while the input 2 provides the logical 2 value. The gates indicated by "m" are 4-valued AND gates and the gates indicated by "M" are 4-valued OR gates.

Step 2. Component Gates: Connecting Each Input x to n Component Gates Ci(x) for 0≤i≤n−1.

Continuing the above example of designing an adder, the adder has two inputs, A and B. The input A is connected to 4 Ci(A) gates:
C0(A), C1(A), C2(A), C3(A)
Similarly, input B is connected to 4 Ci(B) gates:
C0(B), C1(B), C2(B), C3(B)
The result of these connections is shown in FIG. 5.

Step 3. AND Gates: Creating an AND Gate for Each Output Instance (in the Output Columns of the Table from Step 1) "e" Having a Value>0.

For each input instance A0,A1, . . . Am−1=x0,x1, . . . xm−1 that produces an output e>0, an AND gate is created connecting:

$$Cx0(A0) \cdot Cx1(A1) \bullet \ldots \bullet Cxm-1(Am-1) \cdot e$$

For e=en−1, there is no need to connect the AND gate to e, which is the results of simplification based on the postulate that is en−1·A=A, e.g., in 4-valued context, the value 3 "anded" to any value x will equal x.

Continuing the example of designing an adder, for the function that produces S as output (in the S column of the truth table), there are 12 instances that produce an output e>0. For example, referring to the truth table, when inputs A=0, B=1, the output is S=1, thus an AND gate is created connecting: C0(A)·C1(B)·1. In other words, since A=0, the AND gate connects to the output of C0(A) gate (from step 2), and since B=1, the AND gate connects to the output of C1(B) gate (see FIG. 5), and since S=1, the AND gate connects to input 1. As another example, when the inputs are A=0, B=2, the output is S=2. In this case, an AND gate is created connecting: C0(A)·C2(B)·2. Since A=0, the AND gate connects to the output of C0(A) gate, since B=2, the AND gate connects to the output of C2(B) gate, and since S=2, the AND gate connects to input 2. As a final example, when the inputs are A=0, B=3, the output is S=3. In this case, an AND gate is created connecting: C0(A)·C3(B)·3, which is simplified to C0(A)·C3(B), i.e., an input 3 is not required because any value "anded" to 3 in a 4-value gate outputs that value. Twelve AND gates are created for the twelve instances as shown below and the connections are shown in FIG. 5.

C0(A)·C1(B)·1, C0(A)·C2(B)·2, C0(A)·C3(B),
C1(A)·C0(B)·1, C1(A)·C1(B)·2, C1(A)·C2(B),
C2(A)·C0(B)·2, C2(A)·C1(B), C2(A)·C3(B)·1,
C3(A)·C0(B), C3(A)·C2(B)·1, C3(A)·C3(B)·2

Similarly, for the function that produces K as output (in the K column of the truth table), there are six instances that produce output e>0. Six AND gates are created as shown below and the connections are shown in FIG. 5.

C1(A)·C3(B)·1, C2(A)·C2(B)·1, C2(A)·C3(B)·1,
C3(A)·C1(B)·1, C3(A)·C2(B)·1, C3(A)·C3(B)·1

Step 4: OR Gate: Connecting the Outputs of all the AND Gates to an OR Gate, which Produces the Outputs of the Required Function.

Finishing the example of designing an adder, for the function that produces S as output (in the S column of the truth table), the outputs of all twelve AND gates (from Step 2) are connected to an OR gate, as defined below:

$$S=C0(A) \cdot C1(B) \cdot 1+C0(A) \cdot C2(B) \cdot 2+C0(A) \cdot C3(B)+C1\\(A) \cdot C0(B) \cdot 1+C1(A) \cdot C1(B) \cdot 2+C1(A) \cdot C2(B)+\\C2(A) \cdot C0(B) \cdot 2+C2(A) \cdot C1(B)+C2(A) \cdot C3(B) \cdot 1+C3\\(A) \cdot C0(B)+C3(A) \cdot C2(B) \cdot 1+C3(A) \cdot C3(B) \cdot 2$$

Similarly, for the function that produces K as the output (in the K column of the truth table), the outputs of all the six AND gates (from Step 2) are connected to an OR gate, as defined below:

$$K=C1(A) \cdot C3(B) \cdot 1+C2(A) \cdot C2(B) \cdot 1+C2(A) \cdot C3(B) \cdot 1+C3\\(A) \cdot C1(B) \cdot 1+C3(A) \cdot C2(B) \cdot 1+C3(A) \cdot C3(B) \cdot 1$$

The results of all these connections are shown in FIG. 5, which is the 4-valued circuit that implements the four-valued addition of two 4-valued numbers. To reduce the number of logic gates for a circuit, an additional step for minimization could be added into the steps outlined above. The minimization would use multivalued logic to simplify the output equations (e.g. the equations for S and K as defined above).

Designing Multivalued Registers and Control Circuits

To continue the design of the multivalued microprocessor, this section describes the design of the registers and the control circuits. There are 16 registers 5 (shown in FIG. 6), all of which take inputs from processing units through the bus D (from the processing module 2). Each register 5 receives an enable signal E that determines whether to write into that particular register, for implementing both the conditional instructions and the non-conditional instructions. The registers store the results of the current step of computation and provide the data for later steps. Each register can provide its data on buses A, B, and D (to the processing units in the processing module). As shown in FIG. 6, the control signals I, J, and K, controlling the tristate buffers 15, determine whether or not to provide the data to the selected buses. These data are then available for processing according to the function of the various processing units. Register PC serves as the program counter. Any instruction can write into the program counter to function as a Jump statement, i.e., providing the address to which the processor should execute the next instruction. If no instruction is directly written into the PC, then the PC will increase by one after executing the current instruction.

To implement multivalued registers requires multivalued memory cells. Another embodiment of this invention provides a design of a multivalued memory cell that can store any multivalued data. The design is shown in FIG. 7. The multivalued memory cell 25 can be used for building the required registers. The multivalued memory cell 25 is a general purpose cell and the design uses multivalued logic gates. For the multivalued memory cell to store n values, n-valued logic gates are used in the design. For instance, for the multivalued memory cell 25 to store 4 values, 4-valued logic gates are used. FIG. 7 shows a n-valued input D, and two n-valued outputs Q and Q', i.e., NOT(Q). The circuit is constructed using two n-valued OR gates 17, two n-valued AND gates 14, and a n-valued NOT gate 18. As can be seen from FIG. 7, the logic gates are connected such that Q is equal to the output of AND(D, AND(OR(D, Q), OR(D, NOT(Q))). Of course, the multivalued memory cell of FIG. 7 is only one example and other conventional or future developed multivalued memory cells could be used with the circuits described herein.

Besides the multivalued memory cell, another component used in implementing the multivalued microprocessor is the multivalued tristate buffer 15. The tristate buffers 15 are used in FIG. 6 for connecting the registers to the multivalued buses, and are used in FIG. 2 for connecting the processing units to the buses. While FIGS. 2 and 6 only show a single tristate buffer symbol leading to a bus, this symbol represents a tristate buffer for each wire, e.g., the an eight wire output leading to an eight wire bus will require eight tristate buffers. Thus another embodiment of the invention further provides a design of a multivalued tristate buffer. The design of a 4-valued tristate buffer is shown in FIG. 8. If the enable signal (ENB) is not asserted (having value 0 as False), there is no connection as all the 4 transistors (acting like switches) are turned off. When ENB is asserted (having a value 3 as True) that will result in each of the AND gates having one input as True. Then when the Component gate associated with the value of the input also outputs 3 or True, the corresponding AND gate will enable the gate input of the corresponding transistor 27, and thus, the input value will be passed to the output. Stated more generally, to implement a n-valued tristate buffer, an n-valued input is connected to n component gates $C_i$, where $0 \le i \le n-1$. There are n AND gates (ANDi) where each ANDi gate has as inputs (1) an output of one of the component gate $C_i$, and (2) the enable signal. There are n transistors $T_i$, each having a gate, drain, and source. The output of each of ANDi gate is connected to a gate of each transistor $T_i$, the drain of each transistor $T_i$ is connected to a constant value from 0 to n−1, and all the sources are connected together to form the n-valued output. When the enable signal is asserted, the output value is equal to the input value, and when the enable signal is not asserted, the input value is not transmitted to the output.

The control unit of the microprocessor comprises of many decoders. The decoders are shown in FIG. 1 as DEC G, E, I, J, K, and M (located besides the processing units and the registers, and inside the instruction memory, while the Data Storage module also has its address decoder). These decoders decode the instructions and produce many control signals. Thus, a further embodiment of the invention provides a design of a multivalued decoder. The design of the decoder DEC G is shown in FIG. 9. The decoder takes two 4-valued wires and produces 16 control signals. The design of the remaining decoders are similar to this one. To produce the output G0, an AND gate is connect to Component gates 0 and 0; to produce the output G1, an AND gate is connected to Component gates 0 and 1, and so on. In general, this method of designing a decoder can be used for any number of multivalued inputs. One function of the control signals G0 to G15 can been seen in FIG. 2 where, depending on which control signal is True, the tristate buffers associated with a particular processing unit are enabled and that processing unit is allowed to pass its output to the appropriate bus.

The current embodiment of the microprocessor further comprises a control circuit. One example of a control circuit is shown in FIG. 10. The control circuit takes inputs from decoder G, which signals what instruction is being executed. As defined in the Op-Code (Table 2), each instruction is assigned a number. As previously described, when an instruction is being executed, the decoder G (FIG. 9) decodes the op-code and produce the control signal G0, G1, . . . , G15. For instance, when the Add instruction is being executed, G4 will be activated. As shown in FIG. 10, certain of these G signals combined with conditional signals Z, X, N, P (from processing units Movez, Movex, Moven, and Movep) to produce a Write signal. The Write signal is then combined with K signals that indicate which register to write the data, and is also combined with a CLK (clock) signal to produce the enable signal E's for writing the data to the register specified by an instruction. FIG. 6 illustrates how the enable signal E's enable specific registers to receive data from output bus D.

Multivalued Logic Gates

The multivalued logic gates used to construct the multivalued microprocessor described above include the Component gates, the multivalued AND, OR and NOT gates. These multivalued logic gates can be implemented using many different kinds of technologies, including using transistors. One embodiment of the Component gates for 4-valued logic is shown in FIG. 11, in which there are four Component gates C0, C1, C2, and C3. An embodiment of an N-input 4-valued AND gate is shown in FIG. 12, an N-input 4-valued OR gate in FIG. 13, and a 4-valued NOT gate in FIG. 14.

Programming the Multivalued Computer

After completing the design of a multivalued microprocessor, a multivalued computer is constructed by combining one or multiple multivalued microprocessors to additional memory and/or input and output devices. The multivalued computer can then be used to execute programs.

One of the major advantages of the above described multivalued computers is that the programming is much like the programming of conventional binary computers. A sample program is shown in FIG. 15, which multiplies two numbers using a bitwise method well known in binary computation. This sample program is written using the instructions defined for a multivalued microprocessor (Table 2). Other instructions, such as x86 or x64 instruction sets, can similarly be defined for a multivalued microprocessor, thus allowing the multivalued computer to run conventional programs without any changes to the underlying code.

The invention claimed is:

1. A multivalued microprocessor configured to accept an n-valued input and generate an n-valued output, where n is at least 3 voltage values, the microprocessor comprising:
    (a) a multivalued processing module including a plurality of multivalued processing units constructed of multivalued logic gates, wherein (i) the logic gates are configured to distinguish at least three voltage values at inputs to the logic gates and produce at least three voltage values at outputs, and (ii) the plurality of multivalued processing units include at least a Not, an And, an Or, and an Add processing unit;
    (b) a multivalued register file including a plurality of registers, wherein the registers are constructed with multivalued memory cells;

(c) a multivalued instruction memory constructed with multivalued memory cells, the instruction memory configured to transmit an instruction to multiple decoders;
(d) a multivalued data storage constructed with multivalued memory cells;
(e) a plurality of multivalued buses transmitting multivalued data between the processing module, the register file, the instruction memory, and the data storage; and
(f) a plurality of multivalued tristate buffers with a control input positioned between processing units and the bus to which the processing units transmit data.

2. The multivalued microprocessor of claim 1, wherein a multivalued processing module further includes the following multivalued processing units: Move (copy data), Not, And, Or, Add, Sub (subtract), Addi (add with immediate data), Subi (subtract with immediate data), Set (put data into register), Seth (set high), Store (from register to data storage), Load (from data storage to register), Movez (move if zero), Movex (move if not zero), Movep (move if positive), and Moven (move if negative).

3. The multivalued microprocessor of claim 1, wherein an n-valued processing unit is constructed by connecting n-valued logic gates together with n-valued wires, including n-valued AND, OR, NOT, and Component gates.

4. The multivalued microprocessor of claim 3, wherein a plurality of n-valued wires carry n distinct voltages, where n includes 4, 8, or 16 distinct voltages.

5. The multivalued microprocessor of claim 1, wherein one of the registers is a program counter transmitting to the instruction memory an address for a next instruction to be executed by the processing module, where instructions including Move (copy data), Not, And, Or, Add, Sub (subtract), Addi (add with immediate data), Subi (subtract with immediate data), Set (put data into register), Seth (set high), Load (from data storage to register), Movez (move if zero), Movex (move if not zero), Movep (move if positive), and Moven (move if negative), can write into the program counter for enabling every instruction to function as a jump operation.

6. The multivalued microprocessor of claim 1, wherein an n-valued memory cell is constructed to store any one of n numbers coded as 0, 1, 2 . . . , or n−1.

7. The multivalued microprocessor of claim 1, further comprising multivalued decoders for translating multivalued codes of an instruction into control signals.

8. The multivalued microprocessor of claim 7, wherein the multivalued decoders further comprise:
(a) two or more multivalued inputs, each of the n-valued inputs is connected to a set n Component gates, where for m-inputs, there are m sets of Component gates; and
(b) a control signal Gi is the output of an AND gate that connected to m corresponding output of the Component gates to product the value i.

9. The multivalued microprocessor of claim 1, wherein a multivalued bus comprises m (where m>1) n-valued wires (where n>2), capable of transmitting one of n^m possible numbers at any given time.

10. The multivalued microprocessor of claim 1, wherein the multivalued tristate buffers are configured for controlling data flow through the multivalued buses.

11. A multivalued memory cell capable of storing an n value wherein n is at least trinary, the memory cell comprising:
(a) an n voltage value input D, two n voltage value outputs Q and Q', where Q' is NOT(Q);
(b) two multivalued OR gates, two multivalued AND gates, and a multivalued NOT gate; and
(c) wherein the output Q is equal to the output of AND(D, AND(OR(D, Q), OR(D, NOT(Q)))).

12. The multivalued memory cell of claim 11, wherein a multivalued AND gate takes two inputs and produces one output that is a minimal value of the inputs.

13. The multivalued memory cell of claim 11, wherein a multivalued OR gate takes two inputs and produces one output that is a maximal value of the inputs.

14. The multivalued memory cell of claim 11, wherein an n-valued NOT gate takes one input value x and produces one output that is a value of (n−1)−x.

15. A multivalued tristate buffer for connecting multivalued wires to multivalued data buses comprising:
a) an n voltage value input, an n voltage value output, and an enable signal, wherein n is at least three;
b) wherein while the enable signal is asserted, the output value is equal to the input value, and while the enable signal is not asserted, the output is in effect not connected to the input; and
c) wherein the n voltage value input is connected to n Component gates, an output of each of the Component gates is input with the enable signal to an AND gate, an output of each of the AND gates is then used to turn on or off a transistor configured to act as a switch, each of the transistors is connected to a constant value from 0 to n−1, where Component gate $Ci(x)$ is associated with a transistor connecting to constant value i, for $0 \leq i \leq n-1$.

16. The multivalued tristate buffer of claim 15, wherein for an n-valued input x, there are n Component gates $Ci(x)$ for $0 \leq i \leq n-1$; a Component gate $Ci(x)$ produces an output value n−1 whenever the input value of x is equal to i, otherwise it produces an output value 0.

17. A quaternary tristate buffer for connecting quaternary wires to quaternary data buses comprising:
a) a quaternary input, a quaternary output, and an enable signal;
b) wherein while the enable signal is asserted, the output value is equal to the input value, and while the enable signal is not asserted, the output is in effect not connected to the input; and
c) wherein the quaternary input is connected to four Component gates, an output of each of the Component gates is input with the enable signal to an AND gate, an output of each of the AND gates is then used to turn on or off a transistor configured to act as a switch, each of the transistors is connected to one of the constant values (0, 1, 2, 3), where Component gate $C0(x)$, $C1(x)$, $C2(x)$, $C3(x)$ is associated with the transistor connecting to constant value 0, 1, 2, 3.

* * * * *